United States Patent
Armbruster et al.

(10) Patent No.: US 9,663,351 B2
(45) Date of Patent: May 30, 2017

(54) METHOD FOR PRODUCING A WAFER EQUIPPED WITH TRANSPARENT PLATES

(71) Applicant: Robert Bosch GmbH, Stuttgart (DE)

(72) Inventors: Simon Armbruster, Wannweil (DE); Dietmar Haberer, Reutlingen (DE); Stefan Pinter, Reutlingen (DE); Jochen Tomaschko, Herrenberg (DE); Benjamin Steuer, Waldenbuch (DE)

(73) Assignee: ROBERT BOSCH GMBH, Stuttgart (DE)

( * ) Notice: Subject to any disclaimer, the term of this patent is extended or adjusted under 35 U.S.C. 154(b) by 154 days.

(21) Appl. No.: 14/609,645

(22) Filed: Jan. 30, 2015

(65) Prior Publication Data

US 2015/0232328 A1     Aug. 20, 2015

(30) Foreign Application Priority Data

Feb. 17, 2014   (DE) .......................... 10 2014 202 830

(51) Int. Cl.
*B81B 7/00*     (2006.01)
*B81C 3/00*     (2006.01)
*B81C 1/00*     (2006.01)
*G02B 26/08*    (2006.01)

(52) U.S. Cl.
CPC ........ *B81B 7/0067* (2013.01); *B81C 1/00317* (2013.01); *B81C 3/001* (2013.01); *G02B 26/0833* (2013.01); *B81B 2201/042* (2013.01); *B81C 2203/032* (2013.01); *Y10T 29/49789* (2015.01); *Y10T 29/49799* (2015.01); *Y10T 29/49885* (2015.01); *Y10T 29/49888* (2015.01);

(Continued)

(58) Field of Classification Search
CPC .......... Y10T 29/49789; Y10T 29/9799; Y10T 29/49947; Y10T 29/49885; Y10T 29/49888; B81B 7/0067; B81C 1/00317; B81C 3/001; G02B 26/0833
See application file for complete search history.

(56) References Cited

U.S. PATENT DOCUMENTS 6,243,945 B1 *   6/2001   Fujimoto ................ H01L 21/56
                                                         174/521
6,247,229 B1 *   6/2001   Glenn ..................... H01L 21/56
                                                         174/528

(Continued)

FOREIGN PATENT DOCUMENTS

DE    102006053862 A1 *   5/2008   ......... B81C 1/00317
DE    10 2008 040 528       1/2010

*Primary Examiner* — Jermie Cozart
(74) *Attorney, Agent, or Firm* — Gerard Messina (57) ABSTRACT

A production method for a wafer equipped with transparent plates includes: formation of a row of through-holes in a wafer; formation of at least one strip-shaped recess in a wafer surface, each of the through-holes of the same row intersecting partly with the respectively associated strip-shaped recess; an uninterrupted groove being formed in each intermediate region between two adjacent through-holes of the same row, the floor surface of the groove being oriented so as to be inclined relative to the wafer surface by an angle of inclination greater than 0° and less than 90°; and covering at least one through-hole with at least one transparent plate made of at least one material transparent to at least a sub-spectrum of electromagnetic radiation.

8 Claims, 12 Drawing Sheets

(52) U.S. Cl.
CPC .. *Y10T 29/49947* (2015.01); *Y10T 428/24331* (2015.01)

(56) References Cited

U.S. PATENT DOCUMENTS

| | | | | |
|---|---|---|---|---|
| 2003/0211654 A1* | 11/2003 | Kocian | ................ | B81C 99/004 438/116 |
| 2004/0104460 A1* | 6/2004 | Stark | .................... | B81B 7/0067 257/678 |
| 2007/0166864 A1* | 7/2007 | Lee | ...................... | B81B 7/0067 438/52 |
| 2008/0080077 A1* | 4/2008 | Shih | .................. | B29D 11/0074 359/883 |

\* cited by examiner

METHOD FOR PRODUCING A WAFER EQUIPPED WITH TRANSPARENT PLATES

BACKGROUND OF THE INVENTION

1. Field of the Invention

The present invention relates to a method for producing a wafer equipped with transparent plates. The present invention also relates to a method for producing a covering cap for a micromechanical component. In addition, the present invention relates to a wafer and to a covering cap for a micromechanical component.

2. Description of the Related Art

In published German patent application document DE 10 2008 040 528 A1, a production method is described for a micromechanical component, and a correspondingly produced micromechanical component is described. The micromechanical component includes a chip having an adjustable reflective plate and a housing designed to accommodate the chip, having an incident light window. The incident light window can be situated on a covering cap of the housing in such a way that, relative to an external side of the covering cap oriented away from the chip and from the reflective plate in its initial position, the incident light window is oriented with an angle of inclination not equal to 0° and not equal to 180°.

BRIEF SUMMARY OF THE INVENTION

The present invention enables a mechanical production of a multiplicity of attachment surfaces for attaching at least one transparent plate in a position that is inclined relative to the wafer surface, in a single working step/process step. The conventionally executed sequential processing out of a single attachment surface for only one transparent plate on a wafer can thus be replaced by the present invention. The simultaneous mechanical processing of a complete chip row that can be realized by the present invention significantly reduces the production time required to produce a wafer equipped with transparent plates, or to produce a covering cap structured out therefrom for a micromechanical component. Correspondingly, the present invention makes it possible to produce wafers and covering caps for a micromechanical component at lower cost.

Moreover, the present invention enables the use of a milling or grinding pin having a larger outer diameter compared to the tool that can be used in the existing art. In this way, the present invention also increases the operating life of the mechanical tool that is used, resulting in a savings cost. Moreover, the present invention also permits the use of a saw, which was not possible in the existing art.

In an advantageous specific embodiment of the production method, the at least one strip-shaped recess is fashioned in the wafer surface in each case going out from a first segment of a side edge of the wafer up to a second segment of the side edge of the wafer. Such a process can be carried out quickly and reliably, for example using a relatively low-cost saw.

In a particularly low-cost specific embodiment that is easy to realize, at least two through-holes that are adjacent to one another and that intersect with the same strip-shaped recess are covered by the same transparent plate. In particular, a row of through-holes that intersect with the same strip-shaped recess can be covered by only one transparent plate. The covering of a multiplicity of through-holes can therefore take place in one working step by attaching a single transparent plate. The specific embodiment described here of the production method thus significantly reduces the production time. Moreover, this specific embodiment of the production method permits the use of a comparatively large transparent plate, and thus reduces the demands made on the apparatus that can be used to attach the transparent plate.

For example, the at least one through-hole can be covered by at least one optical window, at least one UV window, at least one window having an anti-reflective coating, at least one lens, at least one prism, and/or at least one filter, as the at least one transparent plate. The finally produced wafer can thus be used for a large number of possible applications.

In particular, the at least one transparent plate can be fastened on the at least one through-hole by a fastening means. This can take place in such a way that the at least one through-hole is hermetically sealed by the fastening means and by the at least one transparent plate. The finally produced wafer, or the covering caps structured out therefrom, can thus also be used for an airtight packing of a multiplicity of micromechanical components. For example, in this way a partial vacuum can be realized in the respectively packaged micromechanical component.

In an advantageous development, an outer side, oriented toward the wafer surface, of the at least one transparent plate can be covered with at least one protective lacquer. In this way, damage to the at least one transparent plate can be prevented during transport and/or during further processing of the wafer. Moreover, the at least one protective lacquer can prevent damage or contamination of the at least one transparent plate during structuring out of covering caps from the finally produced wafer.

The advantages stated above are also ensured in a corresponding production method for a covering cap.

The advantages stated above are also realized by a wafer having at least one row of through-holes fashioned in the wafer, and having at least one strip-shaped recess fashioned in a wafer surface of the wafer, each of the through-holes of the same row partly intersecting with the respectively associated strip-shaped recess, and an uninterrupted groove being fashioned in each intermediate region between two adjacent through-holes of the same row, the floor surface of said grooves being inclined to the wafer surface at an angle greater than 0° and less than 90°, and the at least one through-hole being covered by at least one transparent plate made of at least one material that is transparent at least to a sub-spectrum of electromagnetic radiation. The wafer can be further developed according to the specific embodiments described above.

In addition, the advantages are also ensured in the case of a covering cap for a micromechanical component having a bearer element structured out from a wafer, having at least one through-hole on a bearer element side, the hole being covered by at least one transparent plate made of at least one material that is transparent to at least a sub-spectrum of electromagnetic radiation, the bearer element side having at least one uninterrupted groove structured out from an edge of the bearer element side on which the bearer element is structured out from the wafer, running to the single through-hole fashioned on the bearer element side, or to one of the through-holes fashioned on the bearer element side, and a floor surface of the at least one uninterrupted groove being inclined relative to the bearer element side at an angle of inclination greater than 0° and less than 90°. The covering cap can also be further developed according to the above-described specific embodiments.

BRIEF DESCRIPTION OF THE DRAWINGS

FIGS. 1A through 1R show schematic representations of a wafer for the explanation of a first specific embodiment of the method for producing a wafer equipped with transparent plates; FIGS. 1A, 1D, 1G, 1J, 1M, and 1P show top views of the wafer, FIGS. 1B, 1E, 1H, 1K, 1N, and 1Q show cross-sections along the line A-A' in FIGS. 1A, 1D, 1G, 1J, 1M, and 1P, and FIGS. 1C, 1F, 1I, 1L, 1O, and 1R show cross-sections along the line B-B' in FIGS. 1A, 1D, 1G, 1J, 1M, and 1P.

DETAILED DESCRIPTION OF THE INVENTION

Figure 1A:
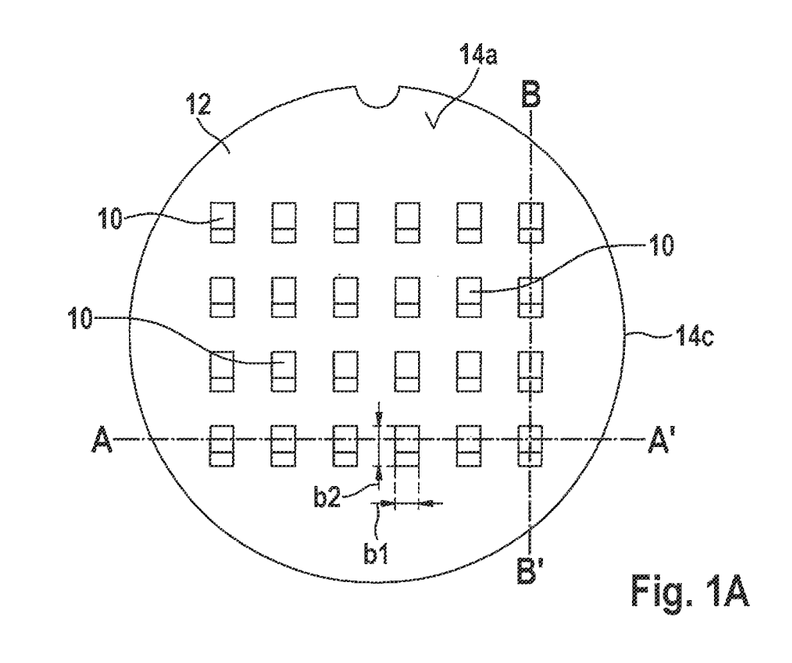
Figure 1B:
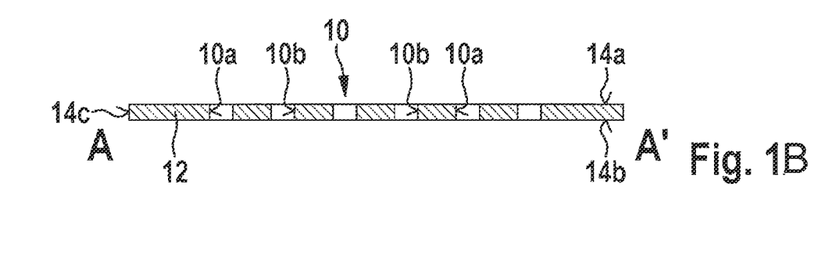
Figure 1C:
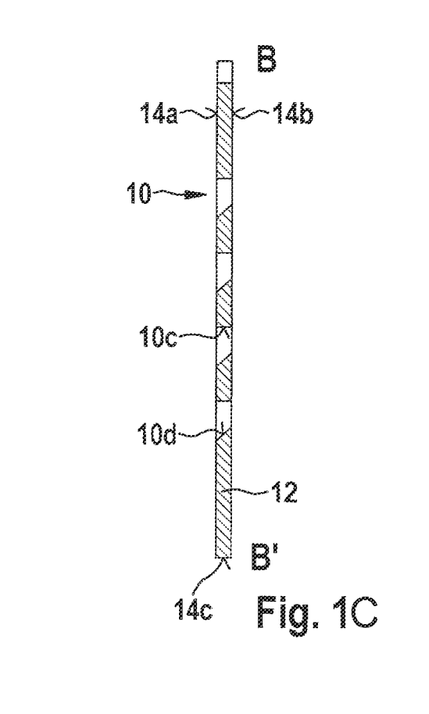
Figure 1D:
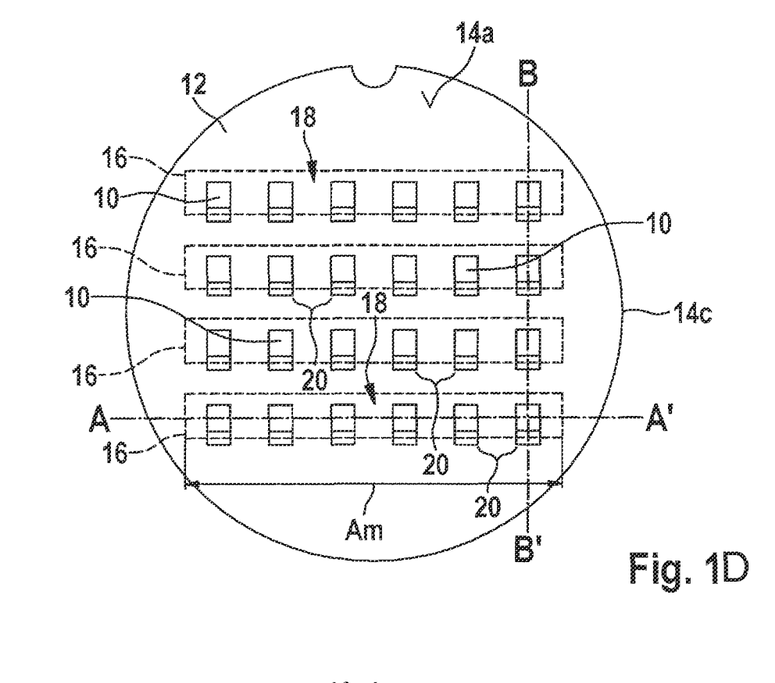
Figure 1E:
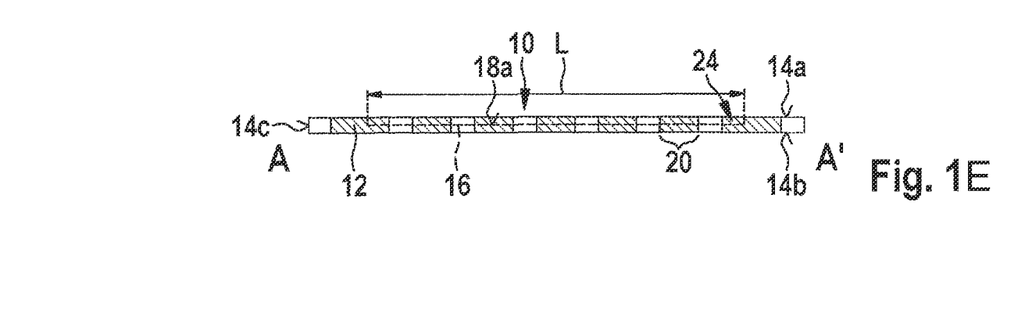
Figure 1F:
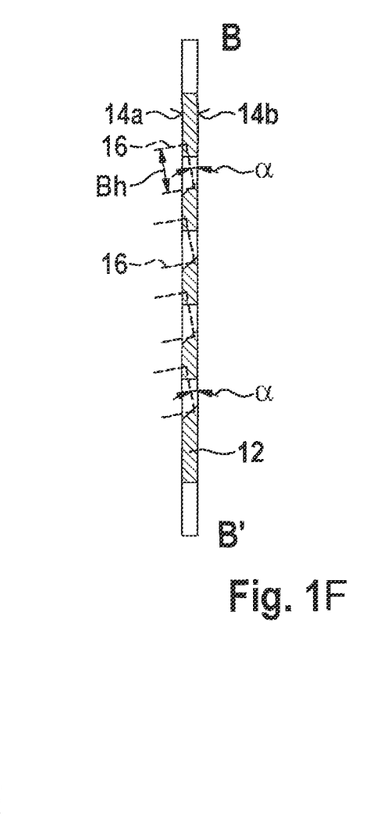
Figure 1G:
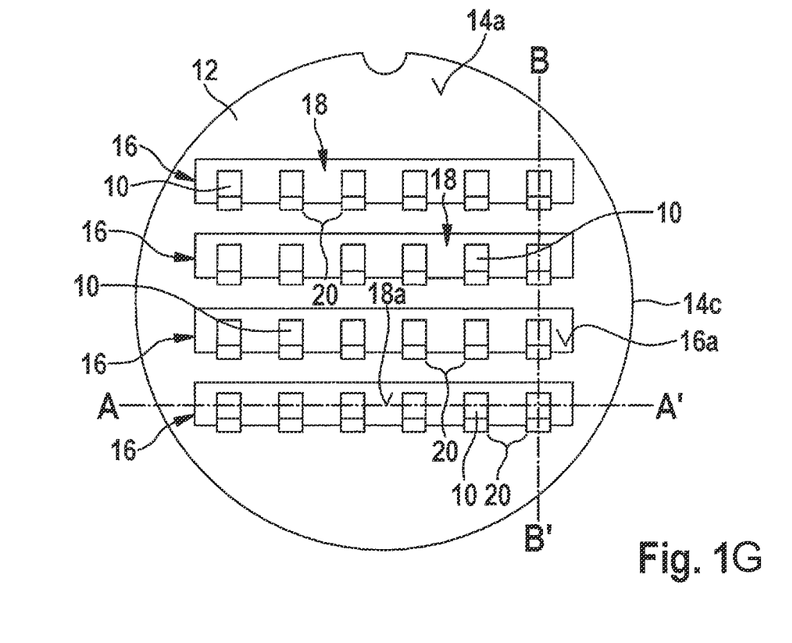
Figure 1H:
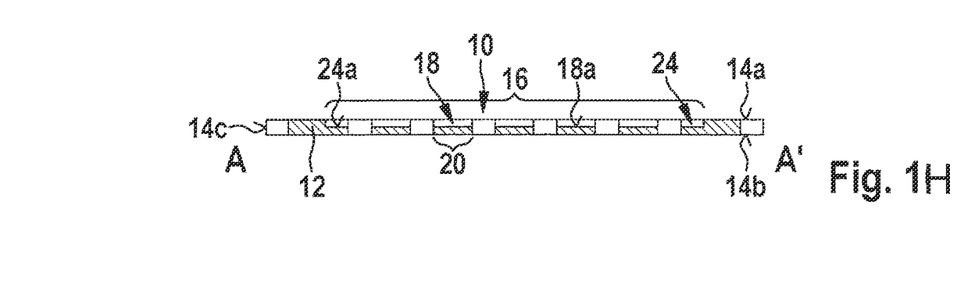
Figure 1I:
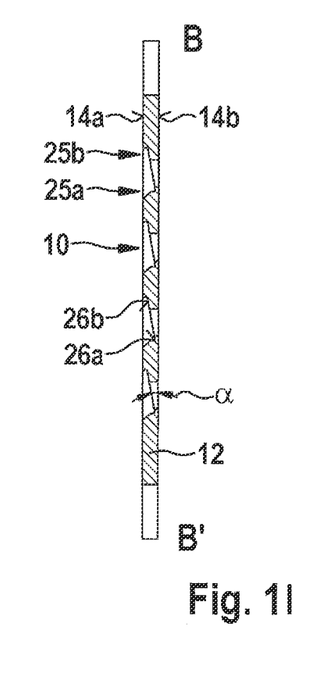
Figure 1J:
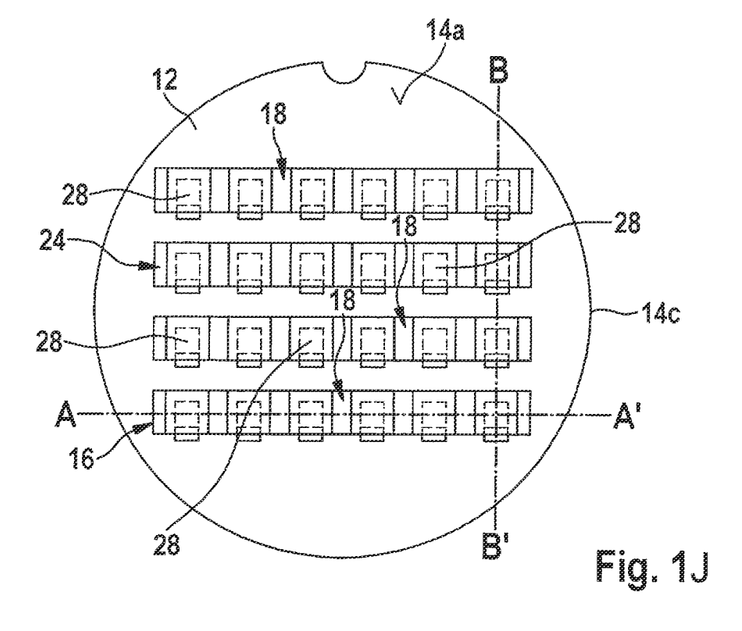
Figure 1K:
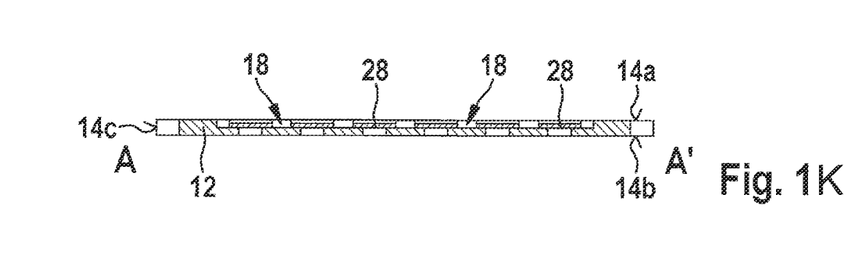
Figure 1L:
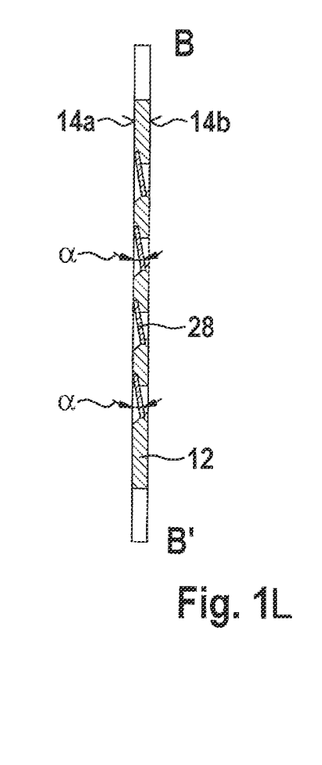
Figure 1M:
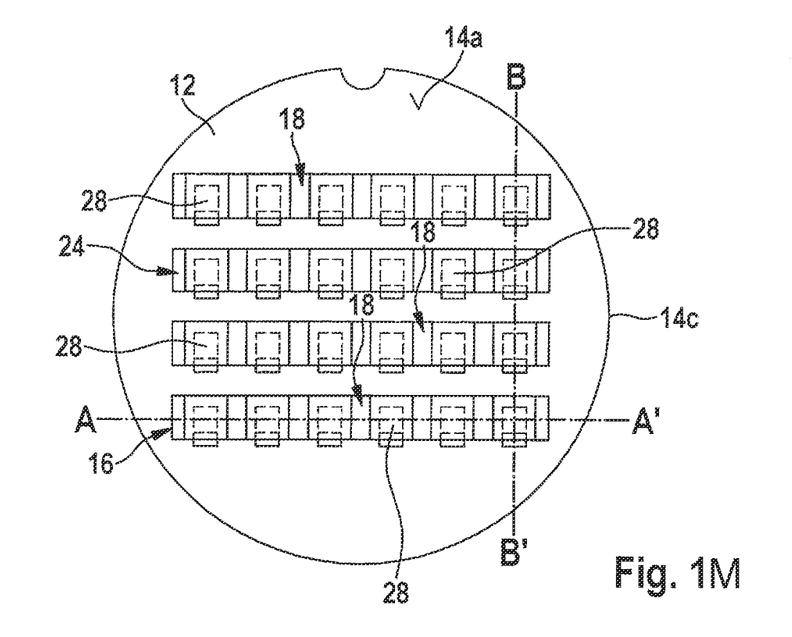
Figure 1N:
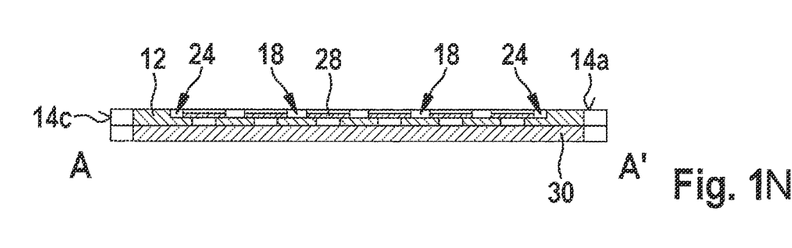
Figure 1O:
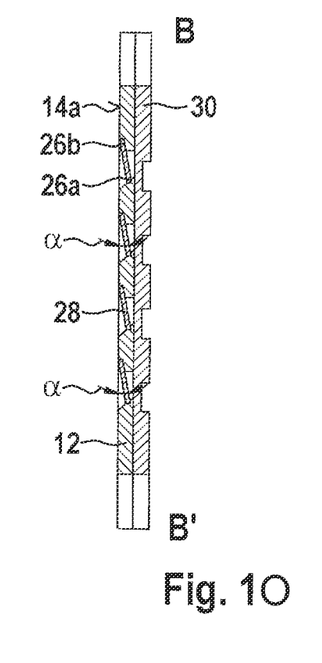
Figure 1P:
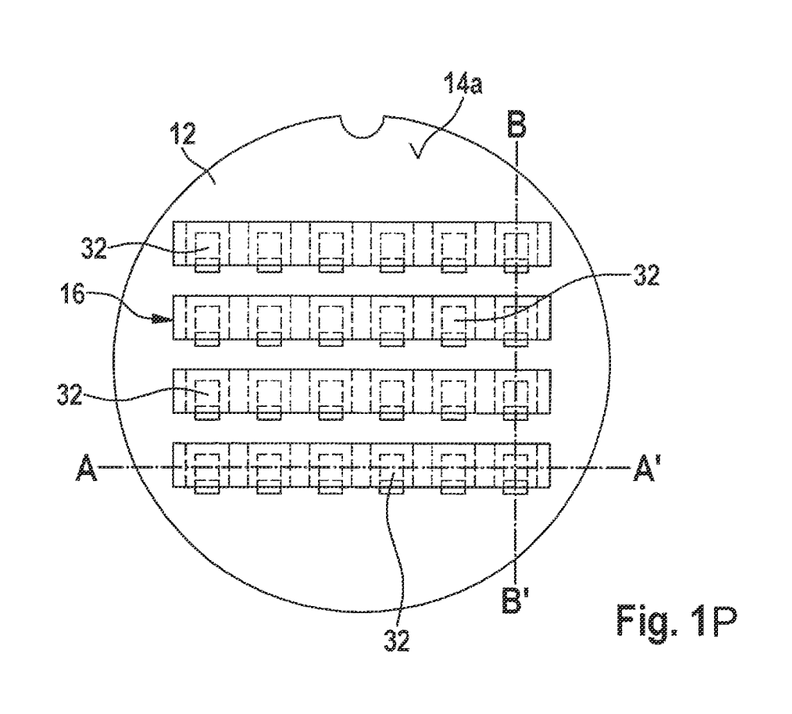
Figure 1Q:
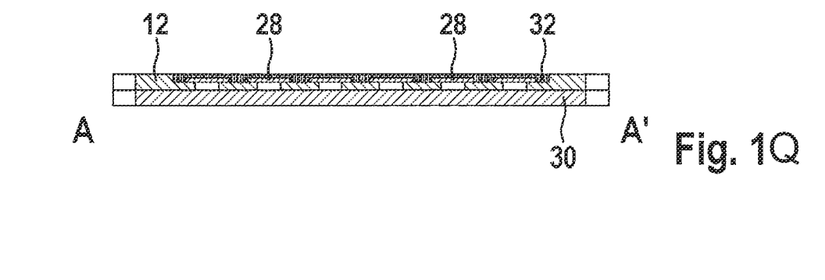
Figure 1R:
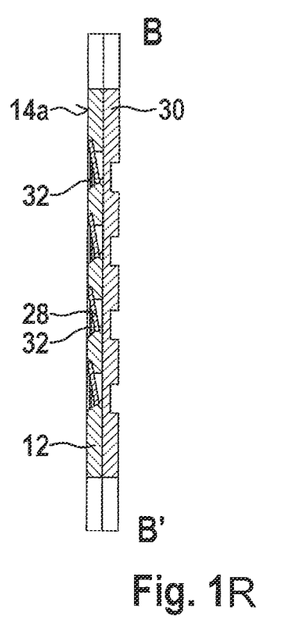

FIGS. 1A through 1R show schematic representations of a wafer for the explanation of a first specific embodiment of the production method for a wafer equipped with transparent plates, FIGS. 1A, 1D, 1G, 1J, 1M, and 1P showing top views of the wafer, FIGS. 1B, 1E, 1H, 1K, 1N, and 1Q showing cross-sections along the line A-A' in FIGS. 1A, 1D, 1G, 1J, 1M, and 1P, and FIGS. 1C, 1F, 1I, 1L, 1O, and 1R showing cross-sections along the line B-B' in FIGS. 1A, 1D, 1G, 1J, 1M, and 1P.

In the method described here, at least one row of through-holes 10 is fashioned in a wafer 12. Here, a through-hole 10 is understood as an opening going through wafer 12. This can also be described by saying that through-holes 10 extend from a first wafer surface 14a of wafer 12 to a second wafer surface 14b oriented away from first wafer surface 14a. Preferably, first wafer surface 14a is oriented parallel to second wafer surface 14b.

Wafer 12, used to carry out the method described here, is preferably a semiconductor wafer. In particular, wafer 12 can be a silicon wafer. However, it is to be noted that the practicability of the method described here is not limited to a particular material of wafer 12.

Through-holes 10 can for example be etched through wafer 12. In the case of a wafer 12 made of silicon, the formation of the at least one row of through-holes 10 can take place for example via KOH etching (potassium hydroxide etching). In order to form through-holes 10, however, a multiplicity of other etching materials may also be used. Likewise, the formation of the at least one row of through-holes 10 can also be accomplished mechanically, e.g. by boring.

Preferably, through-holes 10 fashioned in a row are situated relative to one another in such a way that for their surfaces of intersection with a plane running through first wafer surface 14a, mid-points (not shown) can be defined that are situated on a line A-A'. The lines A-A' of a plurality of rows of through-holes 10 can run parallel to one another. In particular, through-holes 10 of a plurality of rows can form a grid. In this case, the mid-points of the intersecting surfaces (of through-holes 10 of different rows with the plane running through first wafer surface 14a) are also situated on lines B-B'. Preferably, the lines B-B' are oriented perpendicular to the lines A-A' that run parallel to one another. The configuration of through-holes 10 shown in FIG. 1A is however to be regarded only as an example.

In the specific embodiment described here, through-holes 10 having a rectangular cross-section are fashioned along a sectional plane running parallel to first wafer surface 14a. All through-holes 10 of the same row for example have two side walls 10a and 10b oriented perpendicular to the line A-A', the walls being oriented perpendicular to first wafer surface 14a and to second wafer surface 14b. In contrast, only one side wall 10c per through-hole 10, fashioned parallel to line A-A' of the associated row of through-holes 10, is oriented perpendicular to first wafer surface 14a and to second wafer surface 14b. Another side wall 10d per through-hole 10, running parallel to line A-A', is oriented at an angle greater than 0° and less than 90° to first wafer surface 14a and to second wafer surface 14b. It is to be noted that through-holes 10, even without a rectangular cross-section, can each have a side wall 10d running parallel to the line A-A' of their row, the wall being oriented to first wafer surface 14a and to second wafer surface 14b at an angle greater than 0° and less than 90°. In addition to side wall 10d, oriented at an angle to wafer surfaces 14a and 14b, each of the through-holes 10, without a rectangular cross-section, can also have a side wall 10c running parallel to line A-A' of its row, said wall running perpendicular to first wafer surface 14a and to second wafer surface 14b.

Through-holes 10 can for example all be fashioned having the same first (minimum) through-hole width b1 along their associated line A-A' (and parallel to first wafer surface 14a), and/or having the same second (minimum) through-hole width b2 perpendicular to their associated line A-A' (and parallel to first wafer surface 14a). Through-holes 10 can however also have different through-hole widths b1 and b2.

In a further method step, optionally carried out before or after the formation of the at least one row of through-holes 10 in wafer 12, at least one strip-shaped recess 16 is fashioned in first wafer surface 14a of the wafer. Preferably, a strip-shaped recess 16 is formed in first wafer surface 14a for each row of through-holes 10.

The formation of the at least one strip-shaped recess 16 in first wafer surface 14a of wafer 12 is accomplished using a mechanical tool.

Preferably, for this purpose a relative movement is carried out between the mechanical tool and wafer 12. During the relative movement between the mechanical tool and wafer 12, carried out in order to form exactly one strip-shaped recess, the mechanical contact is maintained between the processing surface of the mechanical tool and wafer 12. This can be understood for example as meaning that, during the formation of exactly one strip-shaped recess 16, the same part of the processing surface of the mechanical tool is in uninterrupted mechanical contact with wafer 12. Alternatively, during the formation of exactly one strip-shaped recess 16, a new part of the processing surface of the mechanical tool can continuously contact wafer 12 in such a way that the mechanical contact between the processing surface of the mechanical tool as a whole and the wafer is never interrupted.

The processing surface of the mechanical tool is understood to be a surface of the mechanical tool that, through mechanical contact with wafer 12, brings about a removal of wafer material from first wafer surface 14a of wafer 12. As a rule, the processing surface of the mechanical tool is held/pressed on first wafer surface 14a in such a way that friction occurs between the processing surface and the wafer material, resulting in the desired removal of the wafer material from first wafer surface 14a of wafer 12. Examples of a mechanical tool that can be used are described further below.

In the method described here, the formation of the at least one row of through-holes 10 and the formation of the at least one strip-shaped recess 16 are matched to one another in such a way that each of the through-holes 10 of the same row partly intersects with the respectively associated strip-shaped recess 16, and an uninterrupted groove 18 is formed in each intermediate region 20 between two adjacent through-holes 10 of the same row (which intersect with the same strip-shaped recess 16). The respective uninterrupted groove 18 extends without interruption from a first through-hole 10 of the two adjacent through-holes 10 up to a second through-hole 10 of the two adjacent through-holes 10. In the formation of each uninterrupted groove 18, floor surface 18a thereof is oriented so as to be inclined to first wafer surface 14a. This is to be understood as meaning that floor surface 18a of each uninterrupted groove 18 is oriented at an angle of inclination α to first wafer surface 14a that is greater than 0° and less than 90°. Preferably, floor surface 18a of each uninterrupted groove 18 is fashioned so as to be inclined, in a direction oriented perpendicular to the relative movement, by the angle of inclination α relative to first wafer surface 14a that is greater than 0° and less than 90°. Preferably, floor surface 18a of each uninterrupted groove 18 is also (in particular in a direction oriented perpendicular to the relative movement) fashioned with the same angle of inclination α to second wafer surface 14b, greater than 0° and less than 90°. (Floor surface 18a is understood as a wafer material surface, oriented away from first wafer surface 14a, on the respective uninterrupted groove 18.)

The formation of the at least one strip-shaped recess 16 can take place via grinding, milling, and/or sawing. For each strip-shaped recess 16, a floor surface 16a is ground, milled, or sawed, this floor surface also being fashioned so as to be inclined to first wafer surface 14a with an angle of inclination α greater than 0° and less than 90°.

In the specific embodiment described here, first through-holes 10 are fashioned in wafer 12 (see FIG. 1A through 1C). In FIGS. 1D through 1F, the broken lines show the positions, longitudinal extension(s) L, and width(s) Bh of strip-shaped recesses formed after through-holes 10. The at least one strip-shaped recess 16 preferably has (along its respectively associated line A-A') a longitudinal extension L that is greater than a maximum extension Am of the row, intersecting therewith, of through-holes 10 along the line A-A' of the row. In order to form a respective strip-shaped recess 16, a (previously formed) row of through-holes 10 is gone over with (in each case at least a part) of the processing surface of the mechanical tool without interrupting the mechanical contact between the processing surface of the mechanical tool and wafer 12 in the meantime/during the formation of strip-shaped recess 16. The mechanical contact between the processing surface of the mechanical tool and wafer 12 can be (briefly) interrupted only between a formation of a first strip-shaped recess 16 and a subsequent formation of a second strip-shaped recess 16 on the same wafer 12. FIGS. 1G through 1I show wafer 12 after the formation of the at least one row of through-holes 10, and after the subsequent formation of the at least one strip-shaped recess 16.

The formation of the at least one strip-shaped recess 16 in first wafer surface 14a can however also take place after a formation/etching of the at least one row of through-holes 10. In this case, first the at least one strip-shaped recess 16 is formed in first wafer surface 14a, for which purpose first wafer surface 14a is preferably gone over by the processing surface of the mechanical tool the same number of times as the number of strip-shaped recesses 16 that are to be formed in first wafer surface 14a. During the going over of first wafer surface 14a with (at least a part) of the processing surface of the mechanical tool, the processing surface remains in (uninterrupted) mechanical contact with wafer 12. The mechanical contact between the processing surface of the mechanical tool and wafer 12 can be (briefly) interrupted only between a formation of a first strip-shaped recess 16 and a subsequent formation of a second strip-shaped recess 16 on the same wafer 12. Subsequently, for each strip-shaped recess 16 that is fashioned, a row of through-holes 10 is formed in such a way that the row of through-holes 10 partly intersects with the associated strip-shaped recess 16. Preferably, the at least one row of through-holes 10 is fashioned having a maximum extension Am (along the line A-A' of the row), which is smaller than a longitudinal extension L of the associated recess 16 (along the respective line A-A').

It is again to be noted that in the two above-described process sequences, in each intermediate region 20 between two adjacent through-holes 10 of the same row a respective uninterrupted groove 18 is fashioned with its floor surface 18a situated at an incline to first wafer surface 14a. If the maximum extension Am of a row of through-holes 10 is smaller than the longitudinal extension L of the associated strip-shaped recess 16, the outer through-holes 10 of the same row of through-holes 10 have, at their sides oriented away from adjacent through-hole 10, outer grooves 24 whose floor surfaces 24a are also oriented at an inclination to first wafer surface 14a with angle of inclination α greater than 0° and less than 90°. (Floor surface 24a of an outer groove 24 is understood as a wafer material surface, oriented away from first wafer surface 14a, on respective outer groove 24.) Specifically, outer grooves 24 can also extend up to an adjacent side edge 14c of wafer 12 (between wafer surfaces 14a and 14b).

Preferably, the at least one strip-shaped recess 16 is formed having a width Bh, perpendicular to the associated longitudinal extension, that is larger than the second (minimum) through-hole width b2 (oriented perpendicular to maximum extension A of the associated row of through-holes 10) of through-holes 10. In this way, at through-holes 10, adjacent to first wafer surface 14a, a first widening region 25a and a second widening region 25b are further formed that extend parallel to associated line A-A', and between which the contacted through-hole 10 is situated. Widening regions 25a and 25b also have floor surfaces that are oriented at an angle to first wafer surface 14a by the angle of inclination α greater than 0° and less than 90° and in the following are designated support surfaces 26a and 26b for at least one transparent plate. (Support surfaces 26a and 26b are also oriented at an inclination to second wafer surface 14b by angle of inclination α greater than 0° and less than 90°.)

Preferably, the at least one strip-shaped recess 16 is fashioned in each case going out from a first segment of side edge 14c of wafer 12 up to a second segment of side edge 14c of wafer 12 in first wafer surface 14a. By going over first wafer surface 14a at least once with the mechanical tool, in this way the at least one strip-shaped recess 16 can be fashioned comparatively easily and quickly.

In a further method step, the at least one through-hole 10 is covered by at least one transparent plate 28. The at least one transparent plate 28 is understood to be a covering element that is made of at least one material that is transparent at least to a sub-spectrum of electromagnetic radiation. The at least one transparent plate 28 thus has, for at least the sub-spectrum of electromagnetic radiation, a comparatively high transmission coefficient, or a relatively low coefficient of reflection. For example, the at least one through-hole 10 can be covered by at least one optical window, at least one UV window, at least one window having an anti-reflective coating, at least one lens, at least one prism, and/or at least one filter, as the at least one transparent plate 28. Wafer 12 produced by the method described here is thus suitable for a large number of possible applications.

The at least one transparent plate 28 can be fastened/glued to the at least one through-hole 10 using at least one fastening means/joining means (not shown). For example, before placing the at least one transparent plate 28 into the at least one strip-shaped recess 16, the fastening means/joining means can be deposited on the at least one transparent plate 28. Alternatively, however, before attachment of the at least one transparent plate 28, the fastening means/joining means can also be deposited on the contact surface thereof fashioned on wafer 12, e.g. at least on support surfaces 26a and 26b.

Preferably, the at least one through-hole 10 is hermetically sealed by the fastening means and by the at least one transparent plate 28. A hermetic sealing of the at least one through-hole 10 is easy to realize due to the reliable ensuring of a smooth contact surface (such as support surfaces 26a and 26b) when carrying out the method described here.

For example, a glass solder (seal glass) can be used as a fastening means/joining means. If a glass solder is used as fastening means/joining means, wafer 12 can be heated after the attachment of the at least one transparent plate 28 and of the fastening means/joining means, whereby a hermetically sealed joint connection can be produced between the at least one transparent plate 28 and the material of wafer 12. However, it is to be noted that for the fastening of the at least one transparent plate 28 it is also possible to use a multiplicity of glues, in particular hermetically sealing glues.

In the specific embodiment of FIGS. 1J through 1L, each through-hole 10 is covered by a separate transparent plate 28. The number of transparent plates 28 fastened on wafer 12 preferably corresponds to the number of through-holes 10 that are formed. However, in an alternative specific embodiment, at least two adjacent through-holes 10 intersecting with the same strip-shaped recess 16 are covered by the same transparent plate 28. In particular, an entire row of through-holes 10 can be covered by a single (strip-shaped) transparent plate 28. In this way, the covering of through-holes 10 can be carried out comparatively quickly.

Preferably, the at least one transparent plate 28 is placed in the at least one strip-shaped recess 16 in such a way that an outer side, oriented away from the at least one covered through-hole 10, of transparent plate 28 does not protrude from first wafer surface 14a. In particular, a position for the outer side of the at least one transparent plate 28 is preferred that is inwardly offset relative to first wafer surface 14a. This is easy to realize via a suitable choice of a maximum layer thickness of the at least one transparent plate 28, and a minimum depth of strip-shaped recess 16.

FIGS. 1M through 1O show an optional method step in which a further wafer 30 is fastened on wafer 12. Preferably, further wafer 30 is fixedly bonded or fixedly glued onto second wafer upper side 14b. Further wafer 30 can be structured before the fastening. For example, at least one actuator device can be fashioned on further wafer 30.

In a further optional method step, shown in FIGS. 1P through 1R, an outer side, oriented toward first wafer surface 14a, of the at least one transparent plate 28 can be covered by at least one protective lacquer 32. For this purpose, for example the at least one strip-shaped recess 16 can be filled with the liquid protective lacquer 28, which is subsequently cured. Preferably, for this purpose a protective lacquer that can be stripped off without leaving a residue is used.

Figures 2A, 2B:
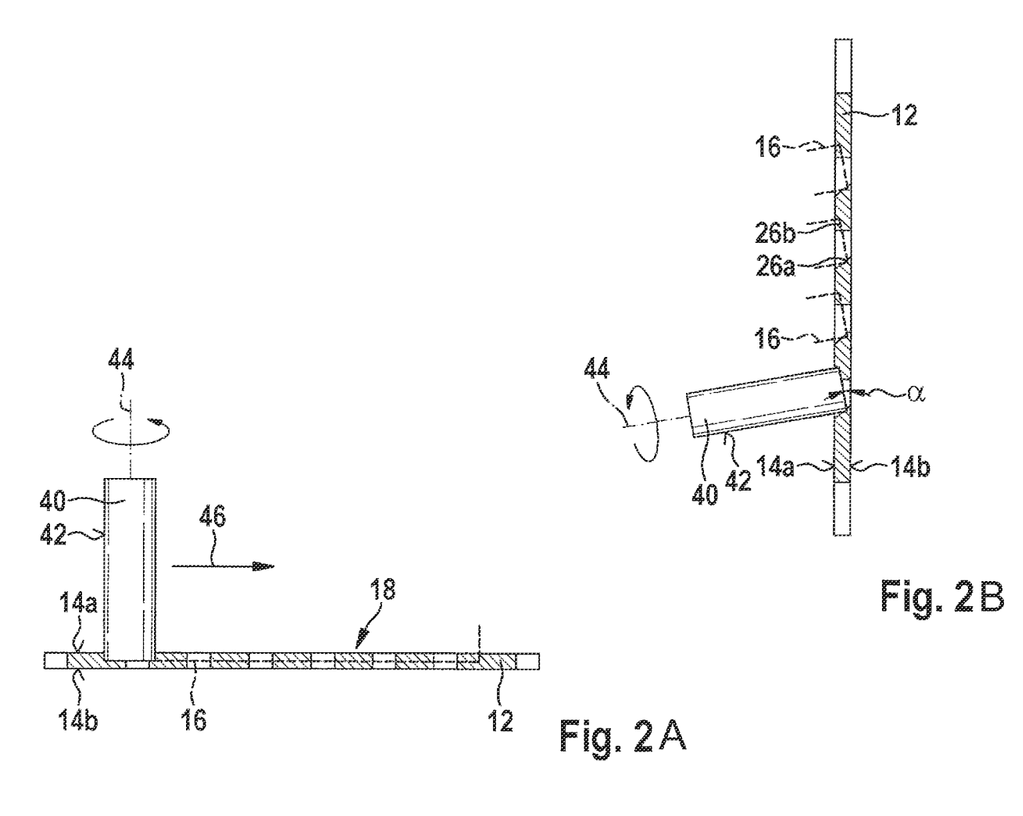
FIGS. 2A and 2B show schematic cross-section through a wafer for the explanation of a second specific embodiment of the method of producing a wafer equipped with transparent plates, the cross-section shown in FIG. 2A running along a scanning direction of a tool that is used, and the cross-section of FIG. 2B running perpendicular to the scanning direction of the tool that is used.

FIGS. 2A and 2B show schematic cross-sections through a wafer for the explanation of a second specific embodiment of the method for producing a wafer equipped with transparent plates, the cross-section of FIG. 2A running along a scanning direction of a tool that is used, and the cross-section of FIG. 2B running perpendicular to the scanning direction of the tool that is used.

In the specific embodiment shown in FIGS. 2A and 2B, an inclined cylindrical grinding or milling pin 40 is used as a tool for the formation of the at least one strip-shaped recess 16 in first wafer surface 14a of depicted wafer 12.

During operation of cylindrical grinding or milling pin 40, its processing surface 42 rotates about an axis of rotation 44. During a formation of a respective strip-shaped recess, a relative movement between cylindrical grinding or milling pin 40 and wafer 12 along a specified scanning direction 46 is carried out. This can take place via a movement of cylindrical grinding or milling pin 40 relative to (stationary) wafer 12, or via a movement of wafer 12 relative to cylindrical grinding or milling pin 40 (held stationary). Moreover, during the formation of a respective strip-shaped recess 16, cylindrical grinding or milling pin 40 (given an uninterrupted mechanical contact between at least a part of its processing surface 42 and wafer 12) is held in such a way that axis of rotation 44 encloses, along scanning direction 46, a right angle with first wafer surface 14a (FIG. 2A), and, along an axis running perpendicular to scanning direction 46 and parallel to first wafer surface 14a, encloses an angle of inclination α with first wafer surface 14a that is greater than 0° and less than 90° (FIG. 2B).

Figures 3A, 3B:
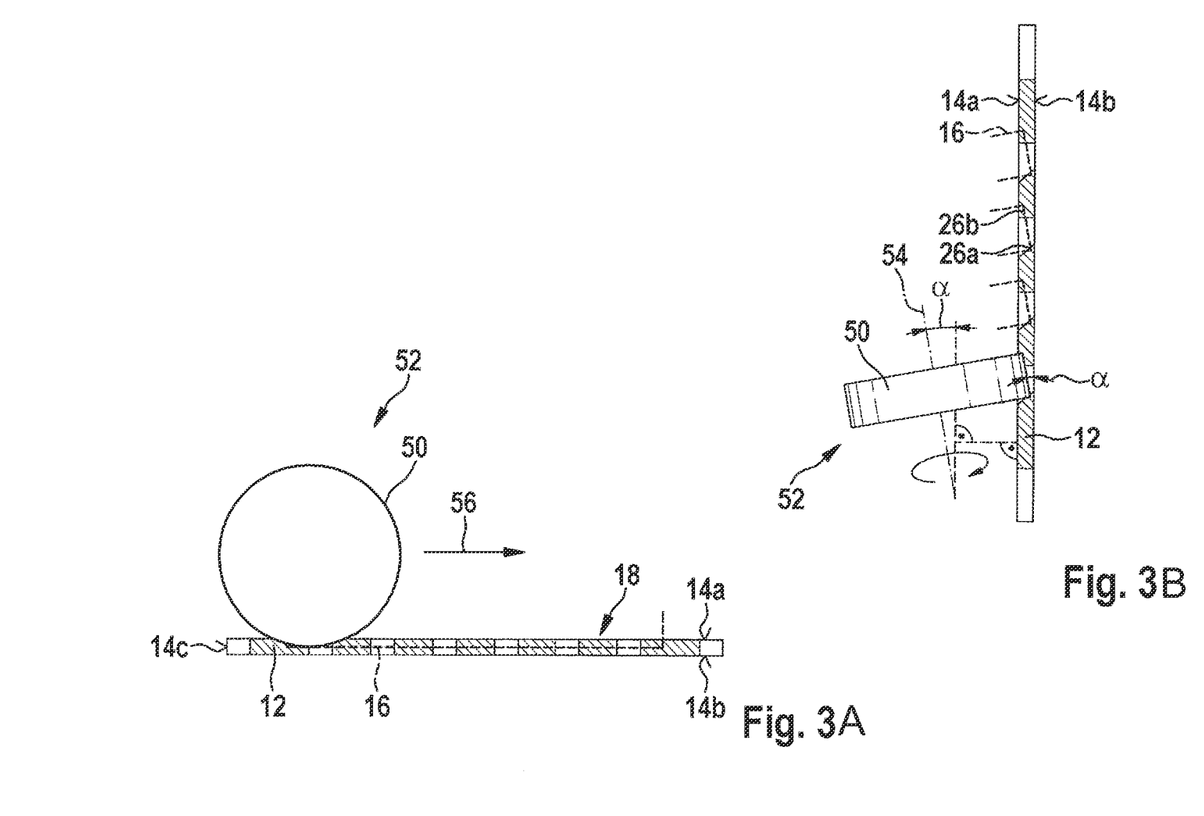
FIGS. 3A and 3B show schematic cross-sections through a wafer for the explanation of a third specific embodiment of the production method for a wafer equipped with transparent plates, the cross-section of FIG. 3A running along a scanning direction of another tool that is used, and the cross-section of FIG. 3B running perpendicular to the scanning direction of the tool that is used.

FIGS. 3A and 3B show schematic cross-sections through a wafer for the explanation of a third specific embodiment of the production method for a wafer equipped with transparent plates, the cross-section of FIG. 3A running along a scanning direction of a tool that is used, and the cross-section section of FIG. 3B running perpendicular to the scanning direction of the tool that is used.

In the specific embodiment of FIGS. 3A and 3B, in each case a row of through-holes 10 is gone over with a cylindrical saw blade 50 of a saw 52. Cylindrical saw blade 50 (used as processing surface) rotates about an axis of rotation 54 during operation of saw blade 50. In this specific embodiment as well, for the formation of a respective strip-shaped recess 16 a relative movement is carried out between cylindrical saw blade 50 and wafer 12 along a scanning direction 56. Optionally, this can take place via a movement of saw blade 50/saw 52 relative to (stationary) wafer 12, or via a movement of wafer 12 relative to (stationary) saw blade 50/saw 52 held stationary. In addition, during the formation of the respective strip-shaped recess 16, cylindrical saw blade 50 can be held in uninterrupted mechanical contact with wafer 12. In addition, during the formation of the respective strip-shaped recess 16 (and during the contact of saw blade 50 with wafer 12), saw 52 can be held in such a way that axis of rotation 54 is oriented so as to be inclined to first wafer surface 14a by an angle of inclination α greater than 0° and less than 90° (FIG. 3B), a projection of axis of rotation 54 and a projection of scanning direction 56 onto first wafer surface 14a being oriented perpendicular to one another.

Figures 4A, 4B:
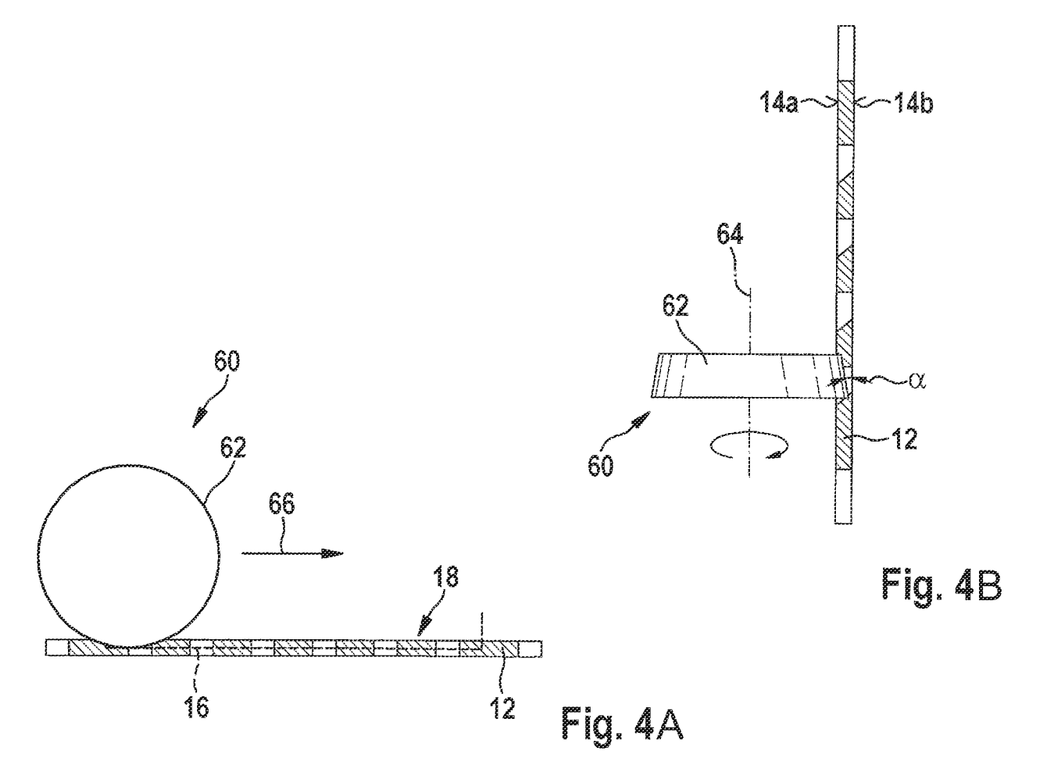
FIGS. 4A and 4B show schematic cross-sections through a wafer for the explanation of a fourth specific embodiment of the production method for a wafer equipped with transparent plates, the cross-section in FIG. 4A running along a scanning direction of another tool that is used, and the cross-section of FIG. 4B running perpendicular to the scanning direction of the tool that is used.

FIGS. 4A and 4B show schematic cross-sections through a wafer for the explanation of a fourth specific embodiment of the production method for a wafer equipped with transparent plates, the cross-section of FIG. 4A running along a scanning direction of a tool that is used, and the cross-section of FIG. 4B running perpendicular to the scanning direction of the tool that is used.

In the specific embodiment of FIGS. 4A and 4B, a saw 60 is used having a frustum-shaped saw blade 62, frustum-shaped saw blade 62 rotating about an axis of rotation 64 during operation of saw 60. For each strip-shaped recess 16, a respective relative movement is executed between saw 60 and wafer 12 along a scanning direction 66. Optionally, this can take place via a movement of saw blade 62/saw 60 relative to (stationary) wafer 12, or via a movement of wafer 12 relative to saw blade 62/saw 60. In this specific embodiment as well, frustum-shaped saw blade 62 is held in uninterrupted mechanical contact with wafer 12 during the formation of each strip-shaped recess 16. In addition, during the formation of each strip-shaped recess 16 (and during the contact of saw blade 62 with wafer 12), saw 60 is held in such a way that axis of rotation 64 is oriented parallel to first wafer surface 14a, a projection of axis of rotation 54 and a projection of scanning direction 56 onto first wafer surface 14a being oriented perpendicular to each other. Due to the inclined profile of frustum-shaped saw blade 62, in this way the desired inclined floor surface 16a of strip-shaped recess 16 is formed automatically.

A wafer 12 produced by one of the above-described methods is recognizable by at least one row of through-holes 10 fashioned in wafer 12, and at least one strip-shaped recess 16 fashioned in a wafer surface 14a of wafer 12, each of the through-holes 10 of the same row intersecting partly with the respectively associated strip-shaped recess 16, and an uninterrupted groove 18 being fashioned in each intermediate region 20 between two adjacent through-holes 10 of the same row, the floor surface 18a of this groove being oriented so as to be inclined to wafer surface 14a by an angle of inclination α greater than 0° and less than 90°, and the at least one through-hole 10 being covered by at least one transparent plate 28 made of at least one material that is transparent at least to a sub-spectrum of electromagnetic radiation.

It is to be noted that wafer 12 produced by the advantageous technology described herein is equipped with at least one transparent plate 28 whose outer surface and whose inner surface are inclined relative to first wafer surface 14a (and preferably also relative to second wafer surface 14b) by the angle of inclination α greater than 0° and less than 90°. The inclination of the outer surface and inner surface of the at least one transparent plate 28 acts, during later use of a covering cap obtained from wafer 12, to screen out disturbing reflections from an image surface.

Figure 5A:
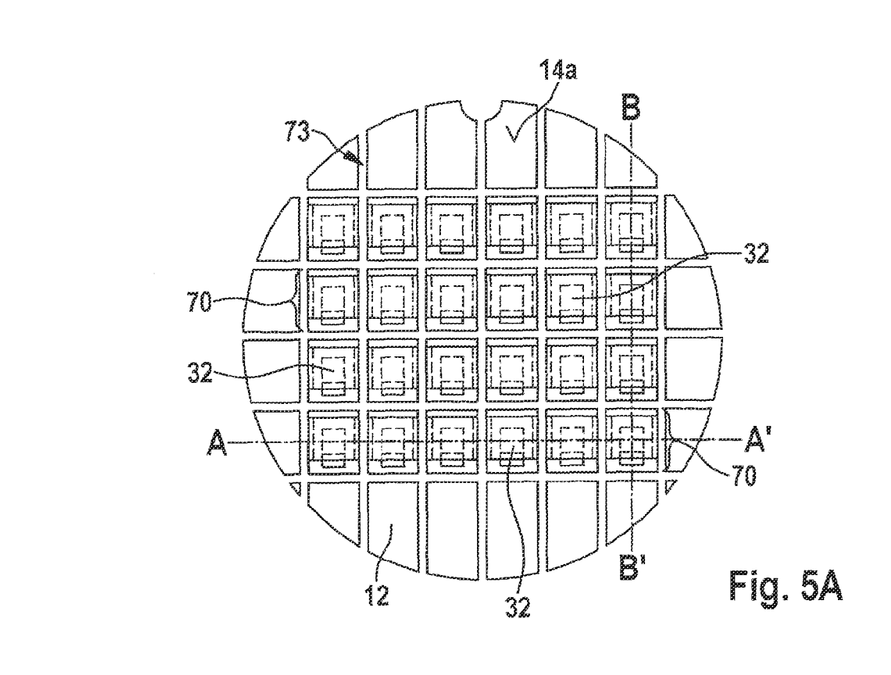
FIGS. 5A through 5F show schematic representations of a wafer for the explanation of a specific embodiment of the production method for a covering cap for a micromechanical component, FIGS. 5A and 5D showing top views of the wafer, FIGS. 5B and 5E showing cross-sections along the line A-A' in FIGS. 5A and 5D, and FIGS. 5C and 5F show cross-sections along the line B-B' in FIGS. 5A and 5D.
Figure 5B:
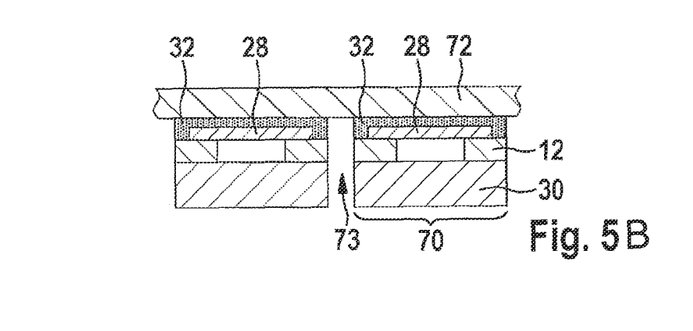
Figure 5C:
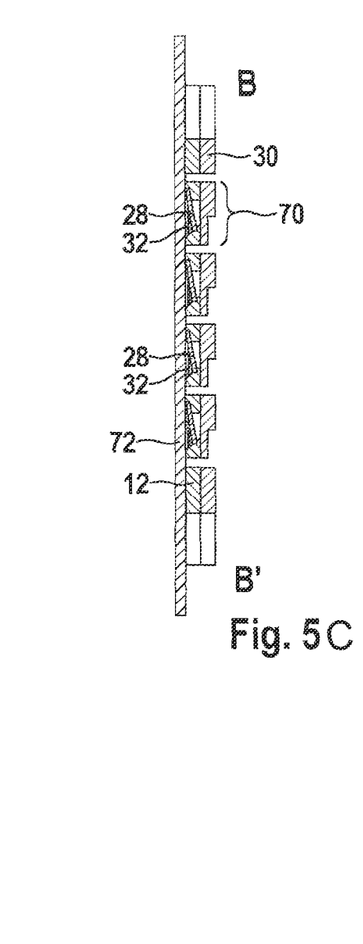
Figure 5D:
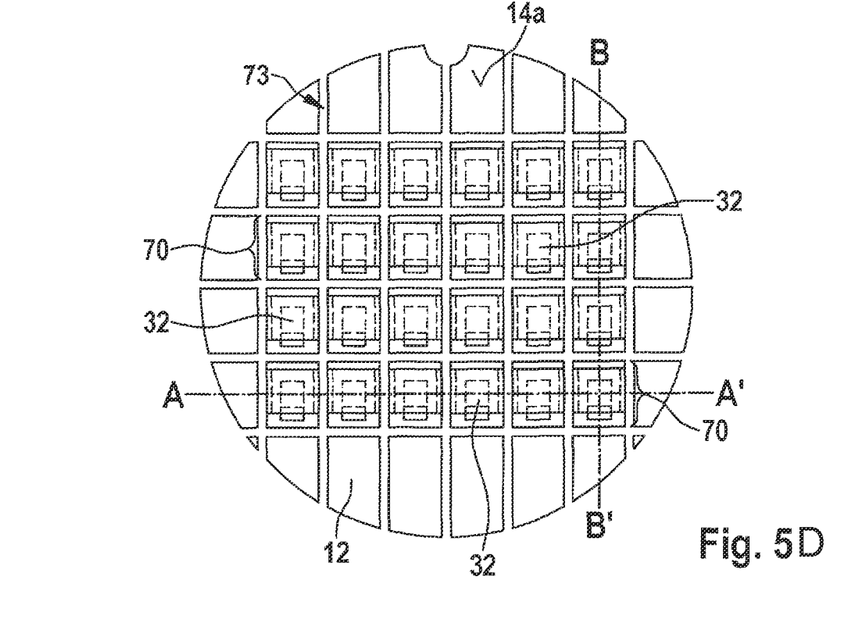
Figure 5E:
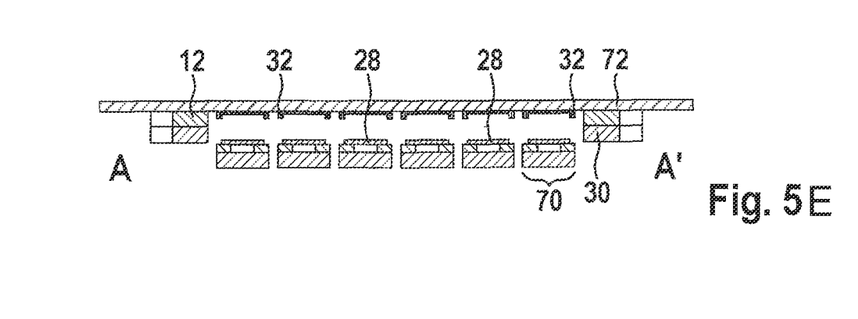

FIGS. 5A though 5F show schematic representations of a wafer for the explanation of a specific embodiment of the production method for a covering cap for a micromechanical component, FIGS. 5A and 5D showing top views of the wafer, FIGS. 5B and 5E showing cross-sections along the line A-A' in FIGS. 5A and 5D, and FIGS. 5C and 5F showing cross-sections along the line B-B' in FIGS. 5A and 5D.

In order to carry out the production method described here, first a wafer 12 equipped with transparent plates 28 is produced. For this purpose, the already-described method steps of the production method for a wafer 12 equipped with transparent plates 28 can be carried out.

Subsequently, as shown in FIGS. 5A through 5C, the (at least one) covering cap 70 is structured out from wafer 12 equipped with transparent plates 28. This takes place for example in that first an adhesive tape 72 is affixed onto first wafer surface 14a of wafer 12, which tape also contacts the at least one cured protective lacquer 32. The adhesive tape 72 that is used can for example be a blue tape or a UV tape. Subsequently, in the specific embodiment of FIGS. 5A through 5C, covering caps 70 are sawed out from wafer 12. During this separation, the at least one protective lacquer 32 prevents sawdust from traveling via saw lines 73 and strip-shaped recess 16 onto the at least one transparent plate 28. Thus, during the separation, no contamination by sawdust will occur of the at least one transparent plate 28. (The at least one protective lacquer preferably fills all gaps between adhesive tape 72 and wafer 12.)

Figure 5F:
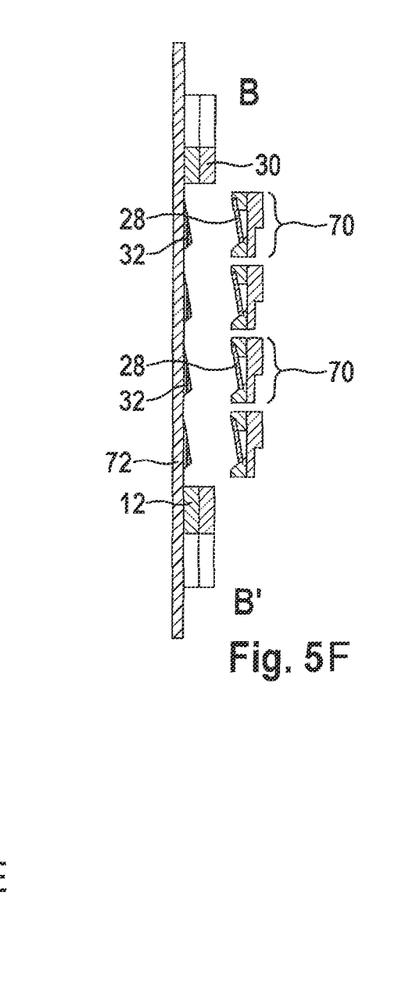

Subsequently, as shown in FIGS. 5D through 5F, separated covering caps 70 are picked off from adhesive tape 72. During the picking off of the separated covering caps 70 from adhesive tape 72, the at least one cured protective lacquer 32 (automatically) remains on adhesive tape 72. The at least one protective lacquer 32 can thus be removed comparatively easily without leaving a residue.

The finally produced covering caps 70 can subsequently be used to cap a micromechanical component, such as for example a micro-mirror.

Figure 6:
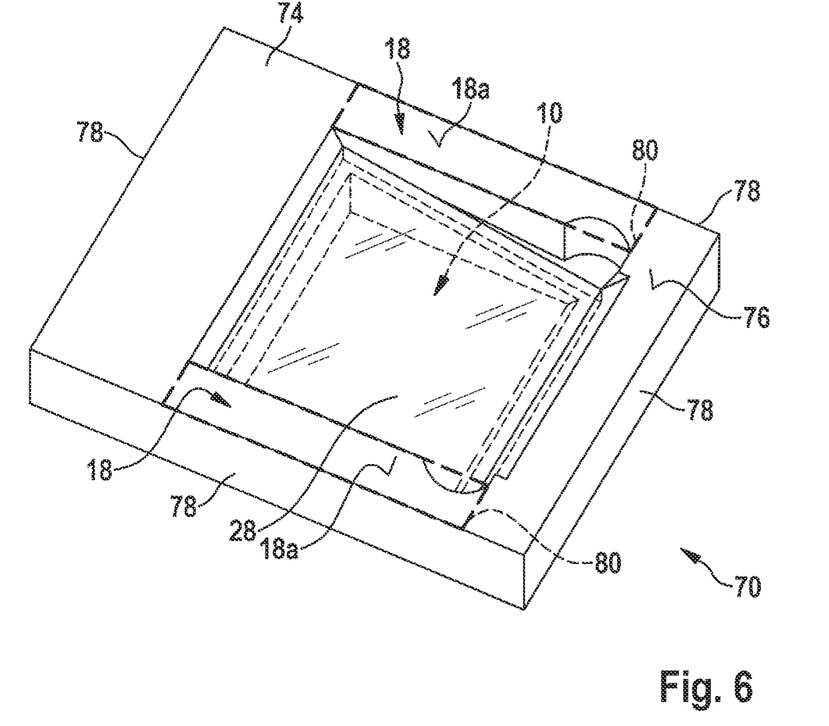
FIG. 6 shows a schematic representation of a specific embodiment of the covering cap for a micromechanical component.

FIG. 6 shows a schematic representation of a specific embodiment of the covering cap for a micromechanical component.

Covering cap 70 shown schematically in FIG. 6 can be used to cap a micromechanical component. Covering cap 70 enables in particular a hermetically sealed wafer level packaging.

Covering cap 70 includes a bearer element 74 structured out from a wafer, having on a bearer element side 76 at least one through-hole 10 that is covered by at least one transparent plate 28 made of at least one material that is transparent at least to a sub-spectrum of electromagnetic radiation. Moreover, bearer element side 76 has at least one uninterrupted groove 18 that runs from an edge 78 of bearer element side 76, at which reflective element 74 is structured out from the wafer, to the single through-hole 10 fashioned on bearer element side 76, a floor surface 18a of the at least one uninterrupted groove 18 being oriented at an inclination to bearer element side 76 by an angle of inclination α greater than 0° and less than 90°. In the specific embodiment shown in FIG. 6, two such grooves 18, whose boundaries are shown by dashed lines 80, are fashioned on bearer element side 76. If, however, a plurality of through-holes are fashioned in bearer element 74, the at least one uninterrupted groove 18 can also extend from edge 78 of bearer element side 76, at which bearer element 74 is structured out from the wafer, to one of the through-holes 10 fashioned on bearer element side 76, and in this case as well floor surface 18a of the at least one uninterrupted groove 18 is oriented at an inclination to bearer element side 76 by an angle of inclination α greater than 0° and less than 90°. In both cases, due to the at least one uninterrupted groove 18, it can be recognized that covering cap 70 has been produced according to the method described above or a variant thereof. (With regard to further properties of covering cap 70, reference is made to the above statements.)

After the capping of a micromechanical component with covering cap 70, the at least one transparent plate 28 ensures an entry and/or exit of a light beam into the micromechanical component packed by covering cap 70. The micromechanical component preferably includes a (possibly adjustable) reflective element that can easily be configured in such a way that its reflective surface, at least in its initial position, is oriented so as to be inclined relative to the at least one transparent plate 28. This can be used for the (automatic) screening out of disturbing reflections from an image surface.

What is claimed is:

1. A production method for a wafer equipped with transparent plates, comprising:
    formation of at least one row of through-holes in a wafer;
    formation of at least one strip-shaped recess in a wafer surface of the wafer, using a mechanical tool;
    wherein the formation of the at least one row of through-holes and the formation of the at least one strip-shaped recess are carried out in such a way that each of the through-holes of the same row intersects partly with the respectively associated strip-shaped recess, and an uninterrupted groove is formed in each intermediate region between two adjacent through-holes of the same row, the floor surface of the groove being oriented so as to be inclined relative to the wafer surface by an angle of inclination greater than 0° and less than 90°; and
    covering at least one through-hole with at least one transparent plate made of at least one material transparent to at least a sub-spectrum of electromagnetic radiation.

2. The production method as recited in claim 1, wherein the at least one strip-shaped recess is configured so as to extend, in each case, from a first segment of a side edge of the wafer up to a second segment of the side edge of the wafer in the wafer surface.

3. The production method as recited in claim 1, wherein at least two through-holes which are adjacent and which intersect with the same strip-shaped recess are covered by a single transparent plate.

4. The production method as recited in claim 1, wherein the at least one transparent plate covering the at least one through-hole is at least one of: an optical window, a UV window, a window having an anti-reflective coating, a lens, a prism, and a filter.

5. The production method as recited in claim 1, wherein the at least one transparent plate is fastened on the at least one through-hole by a fastening element.

6. The production method as recited in claim 5, wherein the at least one through-hole is hermetically sealed by the fastening element and by the at least one transparent plate.

7. The production method as recited in claim 6, wherein an outer side of the at least one transparent plate, oriented toward the wafer surface, is covered with at least one protective lacquer.

8. The production method as recited in claim 1, further comprising:
    structuring out a covering cap from the wafer provided with the at least one transparent plate.

* * * * *